(12) United States Patent
Krech, Jr. et al.

(10) Patent No.: US 6,671,844 B1
(45) Date of Patent: Dec. 30, 2003

(54) MEMORY TESTER TESTS MULTIPLE DUT'S PER TEST SITE

(75) Inventors: Alan S Krech, Jr., Fort Collins, CO (US); John M Freeseman, Fort Collins, CO (US); Randy L Bailey, Ft Collins, CO (US); Edmundo De La Puente, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 434 days.

(21) Appl. No.: 09/677,202

(22) Filed: Oct. 2, 2000

(51) Int. Cl.[7] .......................... G01R 31/28; G06F 11/00
(52) U.S. Cl. ....................... 714/736; 714/742
(58) Field of Search ................. 714/724, 734, 714/718, 742, 701, 715, 738, 736; 324/73.1, 756, 765, 759; 365/201; 711/114

(56) References Cited

U.S. PATENT DOCUMENTS

| | | | | |
|---|---|---|---|---|
| 5,164,663 A | * | 11/1992 | Alcorn | 714/734 |
| 5,214,654 A | * | 5/1993 | Oosawa | 714/718 |
| 5,225,772 A | * | 7/1993 | Cheung et al. | 324/73.1 |
| 5,461,310 A | * | 10/1995 | Cheung et al. | 324/158.1 |
| 5,610,925 A | * | 3/1997 | Takahashi | 714/724 |
| 6,038,181 A | * | 3/2000 | Braceras et al. | 365/201 |
| 6,115,303 A | * | 9/2000 | Fister | 365/201 |
| 6,292,415 B1 | * | 9/2001 | Brehm | 365/201 |
| 6,294,921 B1 | * | 9/2001 | Bonaccio et al. | 324/756 |
| 6,476,628 B1 | * | 11/2002 | LeColst | 324/765 |
| 6,480,978 B1 | * | 11/2002 | Roy et al. | 714/724 |

* cited by examiner

Primary Examiner—Albert Decady
Assistant Examiner—Mujtaba Chaudry
(74) Attorney, Agent, or Firm—Edward L. Miller

(57) ABSTRACT

A memory tester supports testing of multiple DUT's of the same type at a test site. The tester can be instructed to replicate the segments of the test vectors needed to test one DUT on the channels for the other DUT's. This produces patterns of transmit and receive vectors that are n-many DUT's wide. Conditional branching within the test program in response to conditions in the receive vectors (DUT failure) is supported by recognizing several types of error indications and an ability to selectively disable the testing of one or more DUT's while continuing to test the one or more that are not disabled. Also included are ways to remove or limit stimulus to particular DUT's, and ways to make all comparisons for a particular DUT appear to be "good."

2 Claims, 7 Drawing Sheets

MEMORY TESTER TESTS MULTIPLE DUT'S PER TEST SITE

REFERENCE TO RELATED APPLICATIONS

The subject matter of the instant Patent Application is related to that disclosed in a pending U.S. Patent Application entitled MEMORY TESTER HAS MEMORY SETS CONFIGURABLE FOR USE AS ERROR CATCH RAM, TAG RAM's, BUFFER MEMORIES AND STIMULUS LOG RAM, Ser. No. 09/672,650 and filed on Sep. 28, 2000. That disclosure describes aspects of operations called Address Classification and Data Classification that are of interest herein. For that reason U.S. patent application Ser. No. 09/672,650 is hereby expressly incorporated herein by reference.

The subject matter of the instant Patent Application is also related to that disclosed in a pending U.S. Patent Application entitled METHOD AND APPARATUS FOR NO-LATENCY CONDITIONAL BRANCHING, Ser. No. 09/659,256 and filed on Aug. 28, 2000. That disclosure is related to branching in a memory test program that is conditioned upon events within one Device Under Test. The instant Application extends that to a selected Device Under Test from among many such being tested. For that reason U.S. patent application Ser. No. 09/659,256 is hereby expressly incorporated herein by reference.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory tester frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space intester memory. Accordingly, it is desirable to have algorithmic test pattern, generation capability in a memory tester.

Precise signal edge placement and detection is also a consideration in the effectiveness of a non-volatile memory tester. In order to identify parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT (Device Under Test), and receive vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from the pins that contact the DUT. The collection of the algorithmic pattern generation, threshold setting, signal conditioning and comparison mechanisms, and the probes that connect that stuff to the DUT, is called a test site. In the simple case there is one DUT per test site.

Memory testers have interior test memory that is used to facilitate the test process. This interior test memory may be used for several purposes, among which are storing transmit vectors ahead of time, as opposed to generating them in real time, storing expected receive vectors, and storing a variety of error indications and other information concerning DUT behavior obtained during testing. (There are also housekeeping purposes internal to the operation of the memory tester that use RAM and that may appear to fall within the purview of the phrase "interior memory." These are private to the internal operation of the tester, tend to not be visible at the algorithmic level, and are comparable to executable instruction stores and to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank.

At the top level of interior test memory organization there are four Memory Sets, each having its own separate and independent address space and performing requested memory transactions. Two are of DRAM as described above, and two are of SRAM. Each Memory Set has its own controller to which memory transactions are directed. As to externally visible operational capabilities as memories, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets, although actually optional, are typically used for creating a trace for subsequent analysis leading to repair, although there are also other uses. The tester does not enforce major distinctions between the SRAM and DRAM Memory Sets, as to different purposes for which they may be used. There are some practical major distinctions that arise mostly as a matter of size. The SRAM Memory Sets are small, while the DRAM Memory Sets are potentially huge. The person or persons creating the test programming generally make the decisions concerning how the various Memory Sets are to be used. There are also a few minor distinctions where a particular operational feature of the memory tester requires the use of a specific Memory Set. These cases usually arise out of economic or performance considerations that require a dedicated hardware path to a Memory Set. It is expedient to simply pick a likely one, and let it go at that.

The advent of substantial amounts of interior test memory (in the form of the DRAM Memory Sets) raises the issue of how this additional amount of memory can be used to facilitate the operation of desirable features within the memory tester. In the tester of interest the interior test memory subsystem is extremely flexible, in that despite having a native word width of thirty-two bits, the effective word width can be any power of two (up to $2^5=32$), with a corresponding increase in address space for narrower words. There is an extensive address mapping capability, both for addressing DUT's and for addressing interior test memory, substantial data classification and address classification mechanisms that facilitate multiple Tag RAM's and other error analysis tools, all of which are made more practical by having lots of interior test memory. Moreover, these enhancements made possible by more memory do not exist in a vacuum; they are very valuable in the testing of certain types of memory parts.

Despite that recent advances have produced memory parts of truly enormous capacity (512MB) and wide data paths (thirty-two bits), yesterday's four, eight and sixteen bit parts are still solidly in commercial service. It is even the case that some high capacity parts have been "throttled down" to a narrow path for address and data, even at the expense of serialization or of supporting multiple cycle segmentation to transport whole data of a wider native word width. There are various reasons for this situation: either small parts are all that is needed, or, the application is such that big parts can have narrow paths (video applications that are always addressed sequentially). Suffice it to say that there are good economic reasons why memory parts with narrow paths are well received in the market. And that means that they have to be tested.

Consider what this means to a purveyor of a top of the line memory tester that boasts of being able to test parts requiring up to sixty-four channels. From time to time his customer wants to check eight bit parts. What with supplies and ground, I/O bus, clocks and assorted control lines, there are perhaps from twelve to sixteen channels that will be needed. Suppose it is fourteen. Does this mean that fifty channels will be left unused when the part to be tested is located under the test head? Considering that the memory industry considers time on the tester as money, and that memory tester often run twenty-four hours a day, seven days a week, our purveyor and his customer are both interested in ways that make the memory tester more competitive. To the customer, unused test capacity is wasted money. What the designers of the memory tester can do is increase the flexibility and configurability of their machine to allow it to test more parts at once. This defuses the need for the customer to purchase many different models, and even though his per tester cost remains at the top of the line level, the customer gets a fair value in terms of increased throughput, longer life of the investment, etc.

The tester's designers note that sixty-four channels is enough to do as many as sixteen channels four times, and readily reach the conclusion that a combination of four undiced DUT's on a wafer, or four packaged parts, can be construed as some strange single big part that just happens to look exactly like the union of four little parts. There is no question about it: in theory, those four little parts can be tested at the same time, simultaneously, under the same test head. The trouble is that it is awkward and inconvenient. The test program has to be re-written, which is so disgusting that it is not considered a viable solution. This is especially so for flash memory parts, since a failure in one DUT can expose other DUT's being tested under the same test head to undesirable, or even harmful, stresses having to do with excessive numbers of write cycles or repeated high drive levels, brought about by programmed-in escalation triggered by marginal or failed behavior of one DUT. But the designers of test programs want to avoid punishing the innocent along with the guilty, so to speak. (The class of so-called "NAND" parts is especially sensitive to this sort of thing.) The writing of a single-thread-of-control test program that emulates a four-threads-of-control test program, where each of those four threads (what is done for an individual DUT) has conditional branching and other result dependent behavior is, well, a nightmare. That sort of situation would seem to need four independent execution mechanisms with four simple programs whose internal execution paths could independently diverge as needed. But then, how to return to the other extreme, where all sixty-four channels need to be controlled by one program testing an actual single big part? Four little processors do not make a big processor!

There has to be a better way than putting four big processors, or three little ones and one big one, behind the test head. Especially so if test sites are also to be capable of being bonded together to increase their size.

Some types of memory devices require that a write to a location be done many times in order to "program" that location with the written value. There is also an issue called "overprogramming" that refers to needlessly continuing to write the value to be programed at a location after it has been successfully programmed. Such continued writing (overprogramming) can damage the part. There are various techniques that have been used to prevent overprogramming. Since these programming activities usually take place within tightly written loops embedded in other functions, any extraneous activity in the interior loops is inefficient. It would therefore be desirable if the test program overhead needed to program a location and prevent overprogramming could be significantly reduced.

Thus, the situation is this. We have a powerful tester that has an abundance of channels per test site, with powerful algorithmic capabilities to generate patterns and perform failure analysis, and that can attempt repairs by blowing fusible elements in the DUT to cause substitute circuits to replace bad ones. The tester has lots of memory that is easily partitioned, reconfigured and variously mapped, and as such lends itself to maintaining nicely separated results for multiple DUT's, if we could just test them all at the same time on the same test site. But the size of the algorithmic control mechanism of the test site is determined by the maximum number of channels, and does not readily decompose into usable smaller mechanisms. And yet there are all these small parts out there to be tested, and time on the tester is money. What to do?

SUMMARY OF THE INVENTION

The internal architecture of a memory tester is enhanced to support the testing of multiple DUT's of the same type at a test site, while requiring only minor modifications to a test program that would ordinarily be used to test a single DUT. The multiple DUT's are electrically isolated from one another, but are, at least at the outset, given the same stimulus from which the same response is expected. To do this the DUT's are each associated with collections of channels that are to be used to test their respective DUT's. The tester can be instructed to replicate the segments of the test vectors needed to test one DUT on the channels for the other DUT's. This produces patterns of (sequences of) transmit (stimulus) and receive (response) vectors that are "n-many DUT's wide," as it were. Conditional branching within the test program in response to conditions in the receive vectors (DUT failure) is supported by recognizing several types of error indications and an ability to selectively disable the testing of one or more DUT's while continuing to test the one or more that are not disabled. The error indications include per channel functional error flags and per DUT functional error flags, as well as per DUT parametric error flags. The per DUT functional error flags are created from an OR'ing of the per channel functional error flags done in accordance with the DUT to channel association. These flags are reported back to the test program, which can then take various appropriate actions that alter program flow to invoke special testing or other actions for the suspect DUT. The error conditions are also detected by pre-programmed mechanisms within the circuitry that applies transmit vectors and evaluates receive vectors. These latter pre-programmed mechanisms produce actions that include, on a per channel basis, the ability to alter the drive and receive formats for the DUT signal of that channel, and the ability to alter a data value associated with the DUT signal of that channel. Also included are ways to remove or limit stimulus to particular DUT's, as well as ways to make all comparisons for a particular DUT appear to be "good," regardless of the true facts. These latter mechanisms remove the need for multiple threads of execution in the test program.

The test program is thus empowered to simultaneously test a plurality (up to four in a preferred embodiment) of DUT's "in parallel" as long as no errors are reported. Upon an error the test program can branch to an error investigation routine that exercises only the suspect DUT by temporarily disabling the good DUT's while continuing to exercise the bad DUT. If the bad DUT is defective beyond repair, or is unsafe to leave powered up, it can be disabled, the other DUT's re-enabled and regular testing resumed. In this way, a single thread of execution (that would exist in essentially this same form for testing a single DUT) can be selectively switched between (executed on behalf of) the different DUT's on an as needed basis, driven by which one(s) fail(s). During these selectively switched intervals simultaneous testing of all DUT's is suspended in favor of a digression that tests a particular DUT of interest. To be sure, this switching and jumping to execute digressions is also programmatically defined to occur in response to contingent events discovered while testing. Part of this programmatic definition is easily performed modifications to the single threaded test program (which remains single threaded) and part of it is pre-configuration of various hardware assist mechanisms.

These features may be combined with automatic reading of a special bad block table created in interior test memory to facilitate the testing of memory parts that have an internal block structure, by automatically disabling, and removing from further influence on the test program, actions related to a bad block. That bad block may or may not be in a DUT that is being tested in a multi-DUT fashion. These features may also be used to prevent overprogramming.

DESCRIPTION OF A PREFERRED EMBODIMENT

Figure 1:
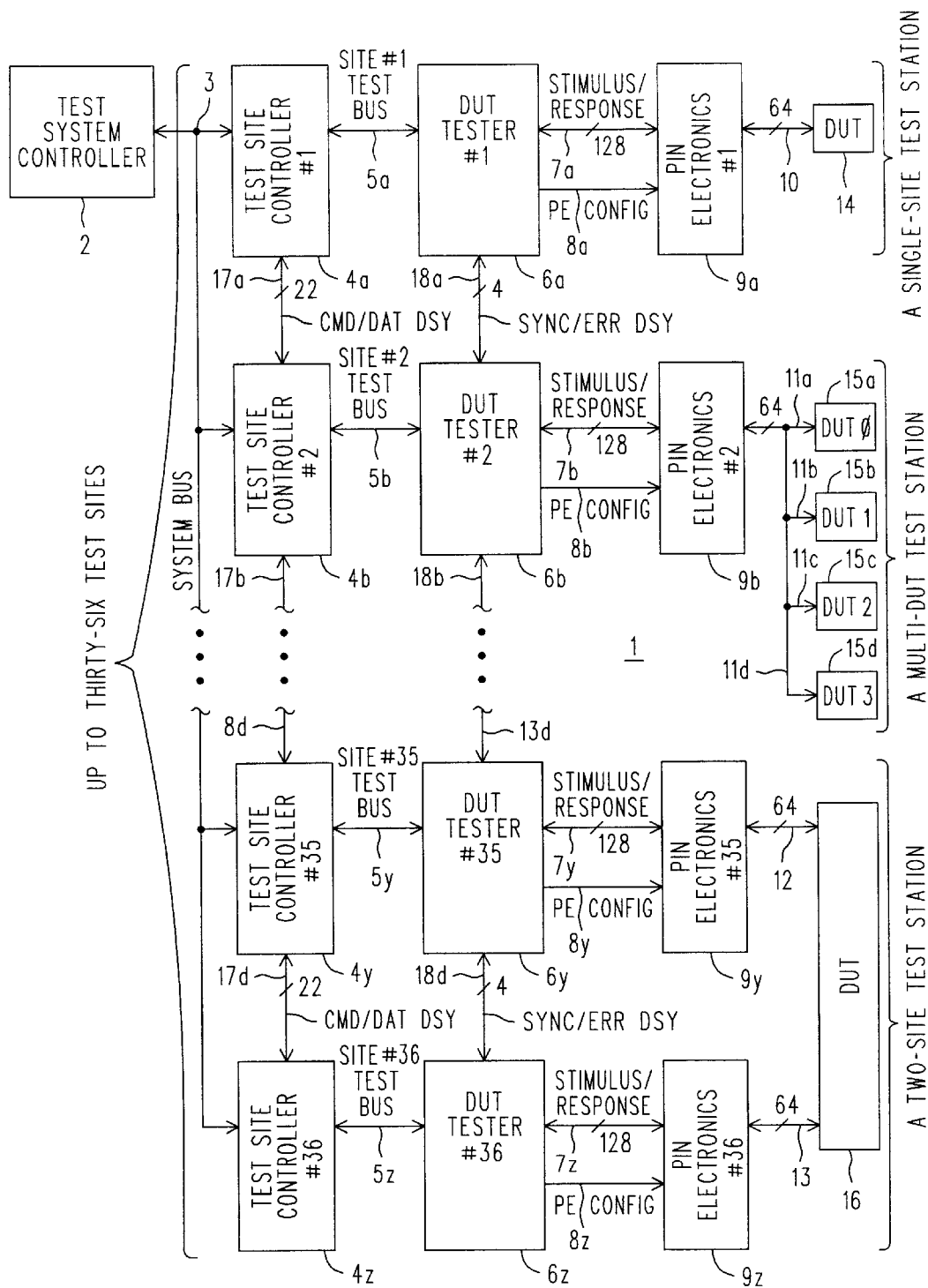
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station".

On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

Figure 2:
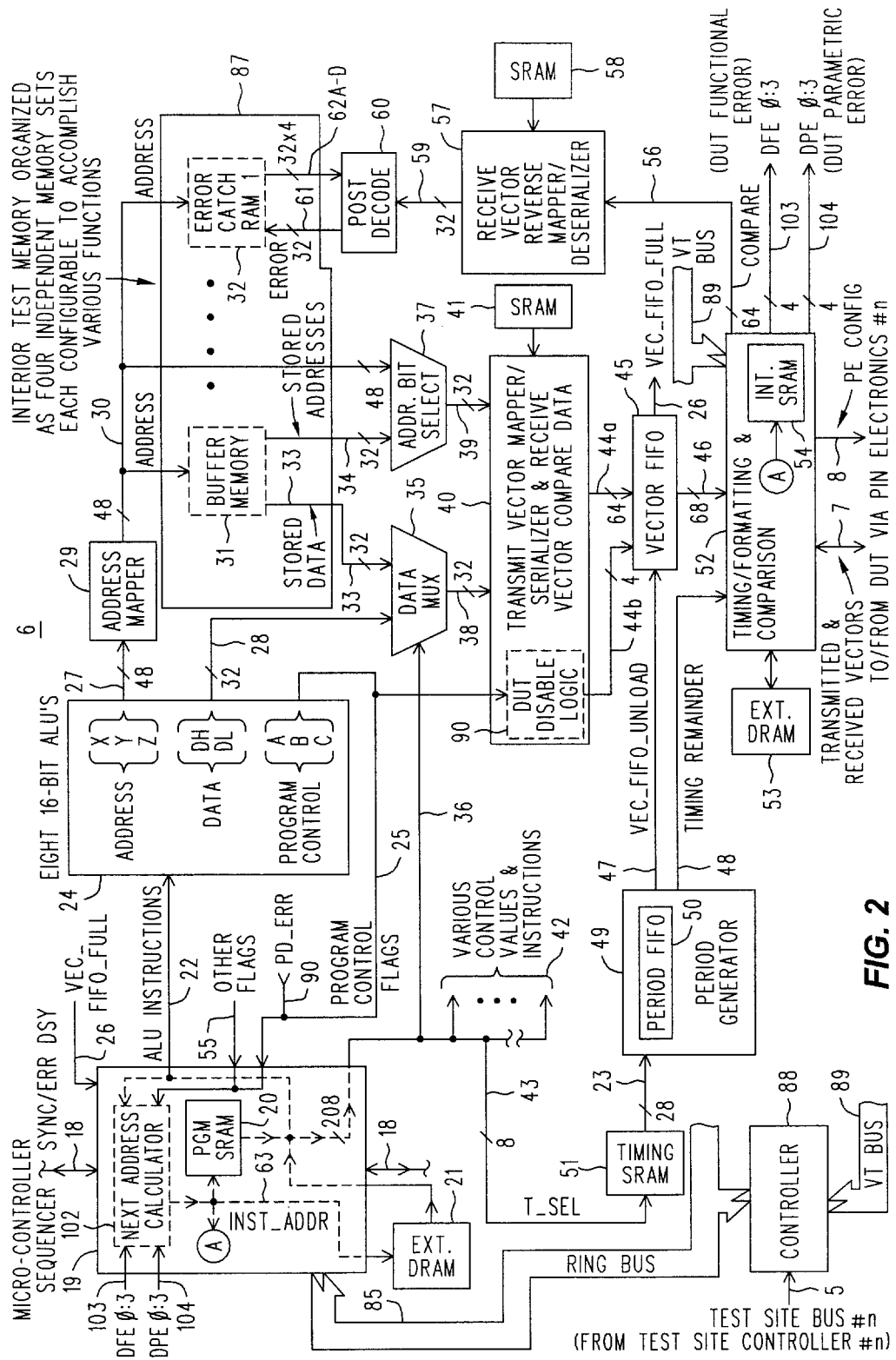
FIG. 2 is a simplified block diagram expansion of the DUT tester 6 of FIG. 1.

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features to be described in due course. In principle, a test program executed by the Test Site could be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT. That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex, and all will be explained in due course. Multi-DUT testing should not be confused with the notion of bonding two or more Test Sites together.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (Oust as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controllers 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's, most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of as programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data.

The Next Address Calculator 102 can implement branching in the test program being executed, in response to unconditional jump either instructions or conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which will be described in due course.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC__FIFO__FULL 26. In another drawing having somewhat less detail it might be lumped in along with the OTHER FLAGS 55. We have separated it out to assist in explaining one aspect of the operation of the Micro-Controller Sequencer 19.

What VEC__FIFO__FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC__FIFO__FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen)

to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to a Buffer Memory 31 and to an Error Catch RAM 32, which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM's used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM 32) are permanent hardware fixtures. What are permanent are the four Memory Sets. But which part of which Memory Set is an Error Catch RAM at any given time (if indeed there is even one defined) is dependent on whatever configuration has been established.

Consider the Buffer Memory 31. Its function is to retain data patterns 33 and addresses 34 that can be applied to the DUT. These are actual separate outputs from the Buffer Memory 31, although the Buffer Memory 31 is not a "dual port memory," but is preferably composed of portions of two different Memory Sets. In keeping with this, it is preferred that Stored Data 33 is kept in one Memory Set, while Stored Addresses 34 are kept in another. Also, we have not shown an explicit mechanism for writing to the Buffer Memory 31. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown—as that would clutter the drawing immensely). Another and faster way of writing information to the Memory Sets is described in connection with FIG. 3.

The Error Catch RAM 32 is addressed by the same address that is applied to the Buffer Memory 31, and it either stores or retrieves information about errors, which operations are performed in conjunction with a Post Decode Circuit, to be discussed later. As with the paths 33 and 34 from the Buffer Memory 31, paths 61 (into the Error Catch RAM) and 62 (from the Error Catch RAM) are preferably MUXed outputs from a portion of a Memory Set (declared to be the current Error Catch RAM 32), in accordance with configuration information distributed by the Ring Bus (not shown).

Note that the Data MUX 35 has as inputs the STORED DATA output 33 from the Buffer Memory 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/Receive Vector Compare Data Circuit 40 (the other component is the output 39 of the Addr. Bit Select circuit 37). Data MUX 35 performs this selection in accordance with values 36 stored in PGM SRAM 20.

Circuit 40 can perform three vector related functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44b (DUT Disable for DUT Zero, for DUT One, etc.) This is in support of multi-DUT testing on a Test Site, and is further explained in due course. The output of Circuit 40 is an up to sixty-four bit vector 44a that, along with the DUT Disable signals 44b, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, and as will be explained in due course, when multiple DUT testing is performed it is known which channels are associated with which DUT's. This allows the production of the four signals DFE 0:3 (DUT # Functional Error) 103 and the four signals DPE 0:3 (DUT # Parametric Error) 104. The use to which these eight signals is put will be described later.

The comparison performed by the Timing/Formatting & Comparison circuit 52 also produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figure 3:
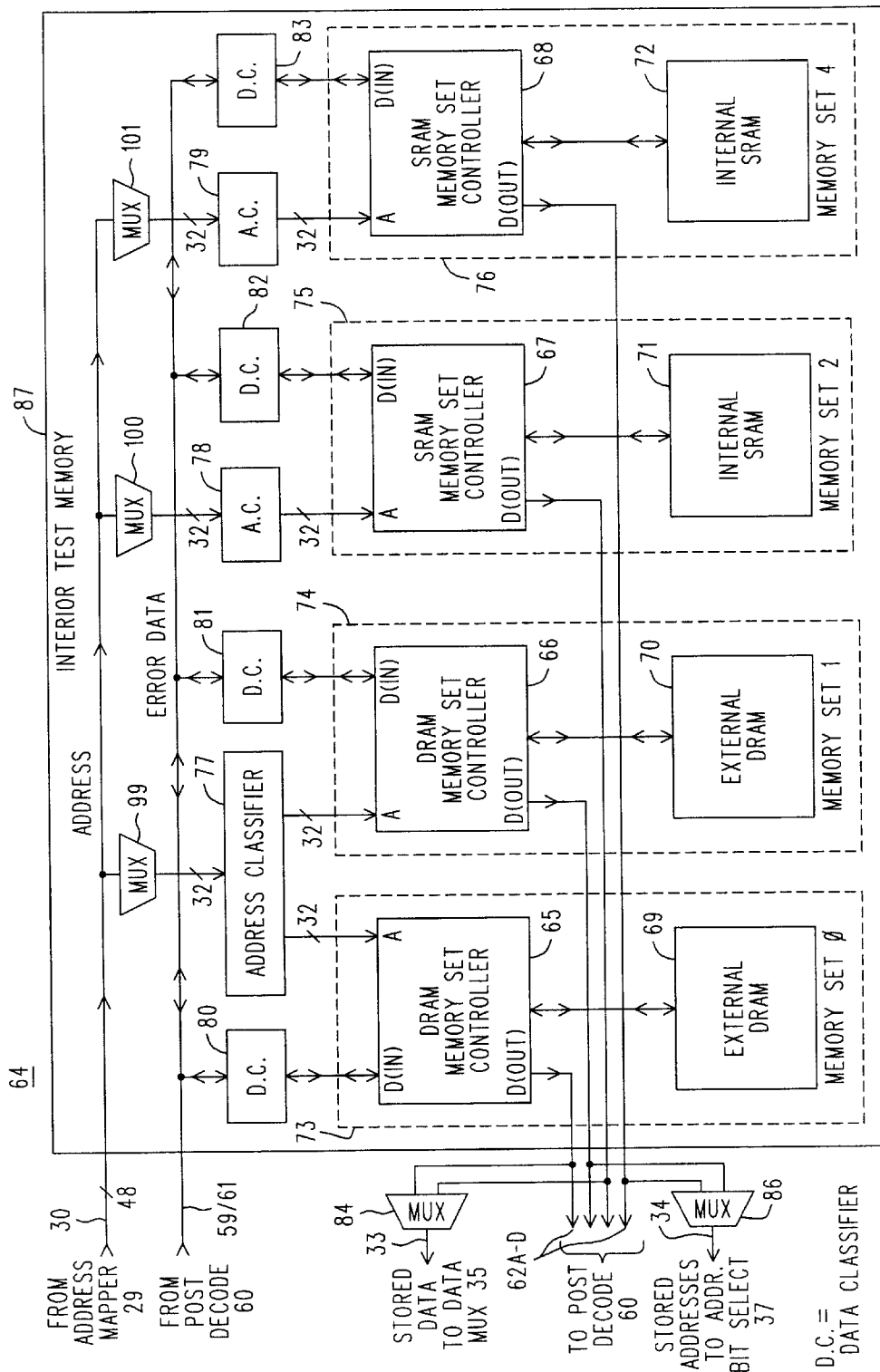
FIG. 3 is a simplified functional block diagram of the interior test memory mechanism that appears in the block diagram of FIG. 2.

Refer now to FIG. 3, which is a simplified block diagram 64 of the Interior Test Memory 87 in the block diagram of FIG. 2. It receives a forty-eight bit mapped address 30 from the Address Mapper 29, which is applied to various Address Classifiers 77, 78 and 79. The Address Classifiers are associated with Memory Sets 73–76, which are each complete memory mechanisms that can individually perform various functions, such as being an ECR 32. Two of these Memory Sets (73, 74) are of external DRAM, while two are of internal SRAM. The two external DRAM Memory Sets will always have the same Address Classifier function in effect, and thus share one common Address Classifier 77. The internal SRAM Memory Sets 75 and 76 each have their own associated Address Classifiers, 78 and 79, respectively. These Address Classifiers can either pass an address through unchanged, or modify it in ways to be described in some detail in due course below.

Each Memory Set includes a Memory Set Controller; the external DRAM Memory Sets 73 and 74 have DRAM Memory Set Controllers 65 and 66, respectively, while the internal SRAM Memory Sets 75 and 76 have respective SRAM Memory Set Controllers 67 and 68. During the testing of a DUT the address for memory transactions directed to any of these Memory Sets arrives at the associated Memory Set Controller from the respectively associated Address Classifier. During the testing of a DUT Error Data 61 arriving from the Post Decode circuit 60 and that is to be written into an ECR is first applied to Data Classifiers 80–83, one of which is associated with each Memory Set. The function of the Data Classifiers will be described in due course below. They may or may not change the data applied to them, depending upon how they are configured and the function they are to perform. The Address and Data Classifiers represent high speed paths for addresses and data, respectively, which are intended to operate at the highest speeds necessary. We shall shortly see that the Ring Bus (not yet shown) provides another way to convey addresses and data to the Memory Sets.

At this point we have four Memory Set Controllers (65–68) that each have incoming (classified) addresses and (classified) data. Each of these Memory Set Controllers is coupled to an associated memory: DRAM Memory Set Controllers 73 and 74 are respectively coupled to external DRAM's 69 and 70, while SRAM Memory Set Controllers 75 and 76 are respectively coupled to internal SRAM's 71 and 72. These arrangements constitute the four Memory Sets 73–76, two of which (75, 76) have modest amounts of high speed SRAM, and two of which (73, 74) have large amounts of slower DRAM. What is of interest to us at present is how the DRAM Memory Sets can be made as fast as the SRAM Memory Sets, as well as how to incorporate certain alternatives concerning configuration of the DRAM, depending upon user preference and test program strategy. Thus, it is going to turn out that the DRAM Memory Set Controllers 65 and 66 are configurable, perform different types of memory transactions, and are not altogether the same as the simpler SRAM Memory Set Controllers 67 and 68. For the sake of brevity, FIG. 3 does not show the structure that provides this flexibility; for now let's just say that each Memory Set Controller is connected to the Ring Bus (not yet shown), from which it is instructed in the particular mode of operation and configuration that are desired. Some of these modes involve how data is stored, and some have to do with getting it back out again. To conclude, then, note that each Memory Set does have an associated Data Out (62A–D) which is sent to the Post Decode Mechanism 60 for further processing. Note also that the data outputs from Memory Sets zero and two are applied to a MUX 84 whose output becomes STORED DATA 33 that is sent to Data MUX 35. Similarly, the data outputs from Memory Sets one and three are applied to a MUX 127 whose output becomes STORED ADDRESSES that are sent to the Addr. Bit Select MUX 37. The reason for having MUX's 84 and 86, and the details of how they are controlled will be discussed in due course below.

Memory Set Two 75 receives a Bad Block Mode signal 105 that is not received by any other Memory Set. The Controller 67 for Memory Set Two uses this signal to support a special mode of operation to be described in due course. What should be understood at this point is that when Bad Block Mode signal 105 is TRUE, and it is not the case that a write memory cycle is being initiated, then the presentation of a new address will cause an automatic read cycle to occur at that address. (A special Bad Block table is being read, and how the data is snagged and put to use is a subject for latter discussion.)

Figure 4:
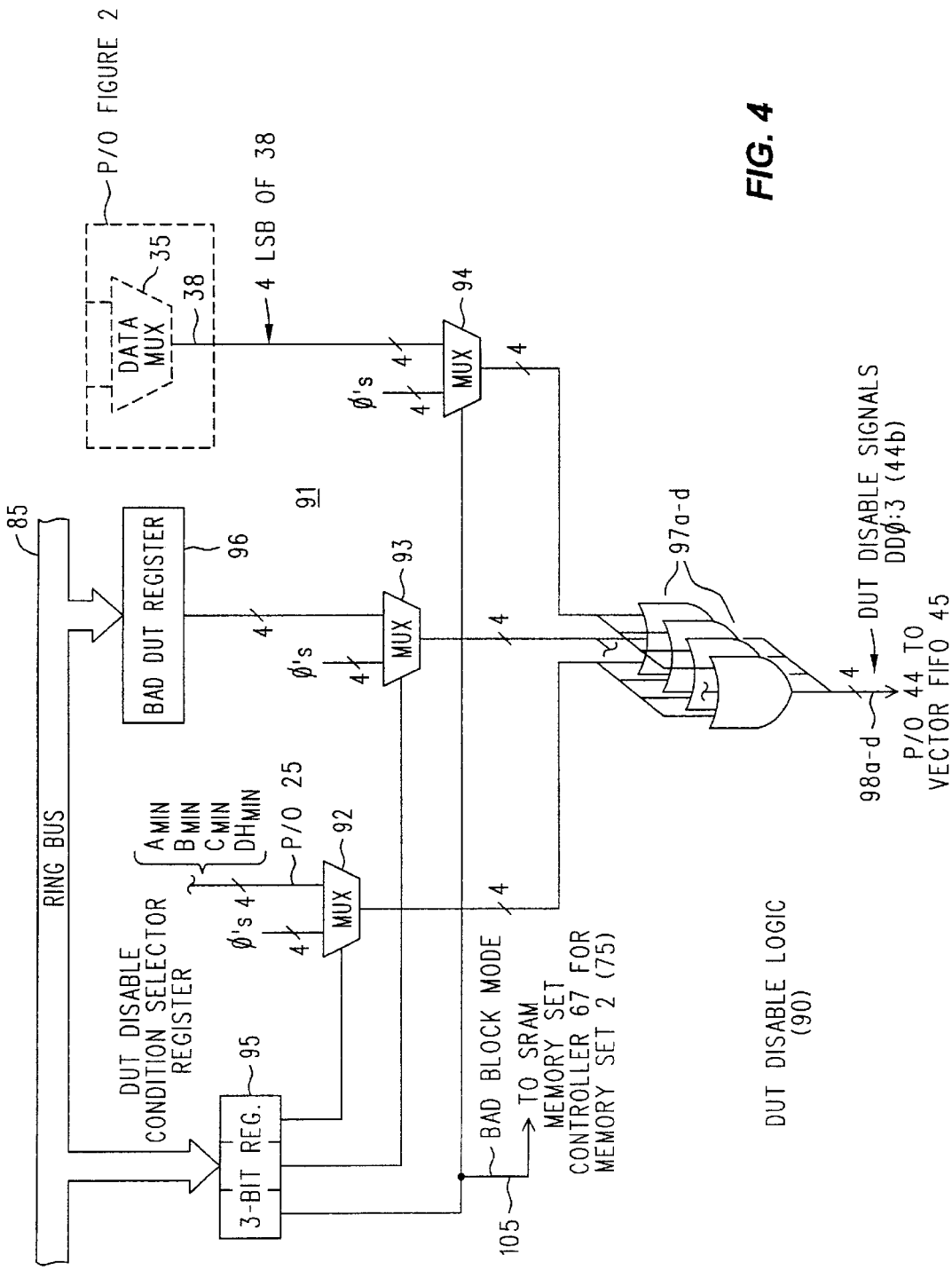
FIG. 4 is a block diagram of a DUT Disable Logic portion of the block diagram of FIG. 2.

Now consider FIG. 4, which is a block diagram 91 of a section of DUT Disable Logic located within circuit 40. It has three MUX's 92, 93 and 94 that function as switches to enable various conditions to disable any or all of the one to four DUT's being tested in a multi-DUT fashion. Our names for these four DUT's are DUT0, DUT1, DUT2 and DUT3. Our immediate goal is to produce corresponding DUT Disable signals DD0:3 (98a–d, which are also 44b). There is a three-bit register 95, called the DUT Disable Selector Register, whose outputs are individually coupled to the respective control inputs of the three MUX's 92, 93 and 94. What each MUX does is select between a collection of four zeros (disable no DUT's) and a collection of four signals that do indicate a DUT to be disabled. Since there are three MUX's, there are three kinds of conditions that disable any of the four DUT's. Any or all of the three conditions may be enabled at any given instant in time, depending upon which bits are set in register 95.

The easiest condition to appreciated is associated with Bad DUT Register 96, a four-bit register coupled to the Ring Bus and settable by the test program. Each of its four bits corresponds to a DUT, and if that bit is set, and MUX 93 is set to select Bad DUT Register 96 instead of its four zeros, then that bit (and perhaps not just one, either) is passed through the MUX 93 and OR gates 97a–d to become the associated DUT Disable signal. Think of this condition as a way to deliberately disable a DUT.

The next condition is pretty easy to appreciate, once it is understood that during multi-DUT testing the test program writer is compelled to associate four of the PROGRAM CONTROL FLAGS 25 with four respective DUT's. (These four flags cannot be used for other purposes during multi-DUT testing, as they might during single DUT testing. This is thought to not be much of a burden. ) These four flags are named $A_{min}$, $B_{min}$, $C_{min}$ and $DH_{min}$. They are associated with the four ALU's A, B, C and DH of circuit 24 in FIG. 2. These ALU's are sophisticated, and have output-value registers that can be pre-set, the ALU's can be told to decrement on command to do so, and a lower limit register associated with each ALU can be pre-set. A comparison mechanism associated with each ALU produces the flags $A_{min}$, $B_{min}$, $C_{min}$ and $DH_{min}$ when the limit for that ALU is reached. Thus, by agreeing to use the A ALU for, say, DUT0, a variable number of events of interest can be registered by decrements to ALU A, which will, after a threshold of tolerance is exhausted (the limit reached) set the flag $A_{min}$ and, by action of block diagram 91 in FIG. 4, indicate that DUT0 is to be disabled.

It will be appreciated that each of the ALU's in circuit 24 of FIG. 2 is a sixteen-bit ALU. This cooperates nicely with multi-DUT testing, since we assume that each of the DUT's in a multi-DUT set-up is identical, that even a single DUT in non multi-DUT testing is thirty-two bits or less, so that the worst multi-DUT case is sixteen bits (two six-bit parts to occupy thirty-two bits). To be sure, exactly what these ALU's get used for is up to the programmer who writes the test program. It is a fairly easy guess to assume that a four- or eight-bit ALU is of very limited use while testing a sixteen-bit part. Likewise, it is perhaps not an absolutely sure thing that a sixteen-bit ALU is sufficient when used as, say a counter, but it very probably is, and there has to be a limit, somewhere.

The third condition is perhaps more involved, although it still boils down to four signals that correspond respectively to the (as many as) four DUT's being tested in the multi-DUT mode. In this case the four signals are the four least significant bits of some word in a table in memory. The addressed entry in the table originates with the address being used to create the transmit vector (notice we didn't say they have the same address, although they could), and the data in that word has been worked on to give it special significance with something called Data Classification. Leaving out the how, those four least significant bits can be fixed up to represent the act of addressing of a bad block within a particular DUT, which DUT can then be disabled. (The different bits within the four LSB's represent the different DUT's, and different addressed words within the table represent the different blocks with a DUT.) This mechanism can be used to keep the other DUT's enabled and just shut down the DUT having the bad block while the bad block is being addressed, to avoid increased execution time and unnecessary drive cycles in the test program by executing to the limits of the loop indices. (For some devices the lifetime of the part is limited by the number such cycles that are possible, so we don't want to use them up needlessly.) The effect is to disable only the bad block rather than treat the entire DUT as in need of disabling all the time. The underlying idea is that the bad block in that DUT might be repairable, and that we need to continue testing for the other blocks in that DUT until we know for sure that the DUT is too far gone to be repaired.

The signal BAD BLOCK MODE 105 is TRUE whenever MUX 94 is used to enable the DUT-disble-by-bad-block-table technique described above. It is used by a particular Memory Set designated at the factory to be the one that is to cooperate by holding the bad block table. This association could be user selectable, but so far not one has found a good reason to make it so. Also, we refer that the Memory Set involved be an SRAM Memory Set. What BAD BLOCK MODE signal 105 does is to tell the Memory Set Controller to automatically read when a new address 30 is presented. This is done to make table entries in the bad block table (which will be in Memory Set Two, and indexable by a previously arranged address classification paradigm) automatically available at the same rate as the test program needs them. Various examples and applications for the techniques of Address Classification and Data Classification are set out in the incorporated disclosure entitled MEMORY TESTER HAS MEMORY SETS CONFIGURABLE FOR USE AS ERROR CATCH RAM, TAG RAM's, BUFFER MEMORIES AND STIMULUS LOG RAM.

To this point we have described how to indicate which DUT's are to be disabled, assuming we can decide to do so programmatically (and we do so assume). We have not yet shown how a DUT is actually disabled. It is to that task that we now turn.

Figure 5:
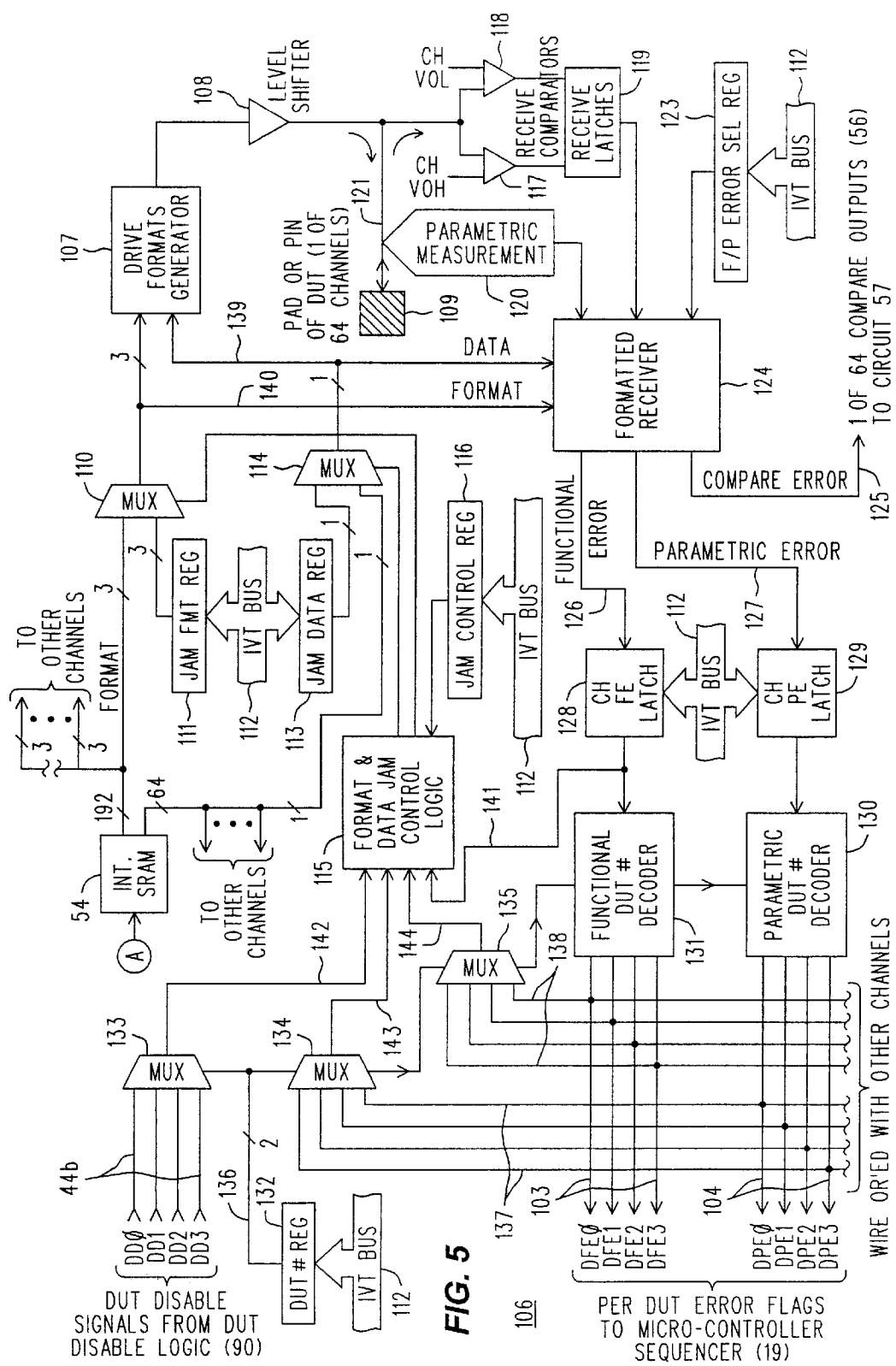
FIG. 5 is a simplified block diagram, most of which is of a portion of the TIMING/FORMATTING & COMPARISON circuit of FIG. 2, that describes how individual channels are automatically disabled during multi-DUT testing.

Refer now to FIG. 5, which is a simplified block diagram 106, most of which is of a portion of the TIMING/FORMATTING & COMPARISON circuit 52 of FIG. 2. What block diagram 106 describes is how various errors are detected and subsequently related to individual DUT's during multi-DUT testing, and how individual DUT's are disabled. Most of what is depicted in FIG. 5 is on a per channel basis, which is to say 1/64 of the actual amount, with the further understanding that in an actual implementation the sixty-four instances are spread across eight chips. Each of the eight chips (which we never show as individual items) is coupled to the VT Bus 89, and replicates it as an internal version thereof called the IVT Bus 112 (Internal VT Bus). The IVT Bus serves a function within the circuit 52 similar to that of the Ring Bus in the APG portion of FIG. 2; it is the under-the-floorboards utility communications mechanism.

To continue, block diagram 106 includes a Drive Formats Generator 107, whose job it is to take three bits of FORMAT 140 and one bit of DATA 139, all associated with a particular channel, and variable on a per vector basis, and create the drive signal actually applied to a pin or pad 109 of a DUT. There are four drive formats, and they are NR (Non Return), RZ (Return to Zero), RTO (Return to One) and SBC (Surround By Complement). These drive formats will be appreciated as conventional by those skilled in the art, and are believed to require no further explanation. When accompanied by the DATA value for the channel in the vector, the indicated FORMAT determines much of what is applied to the pin 109. The signal that leaves the Drive Formats Generator is applied to a level shifter (actually part of the Pin Electronics 9), after which it (121) is connected to the pad 109 via a probe.

There are also four receive formats, making a total of eight formats. The Drive Formats Generator 107 gets a three bit signal 140 that indicates which one of the eight formats is in effect at any instant in time. It also gets the data signal 139. The Drive Formats Generator 107 ignores encodings that are not drive formats, and does not drive if it does not receive a drive format.

Also connected to pin or pad 109 via conductor 121 are Receive Comparators 117 and 118 (which may also be part of the Pin Electronics 9). Each Receive Comparator is also coupled to a corresponding threshold voltage, CH VOH and CH VOL (Channel Voltage Out High and Channel Voltage Out Low). The Receive Comparators are coupled to Receive Latches 119, whose combined values for any given receive cycle can indicate High, Low or Between.

A Parametric Measurement Unit 120 is coupled to conductor 121, as well. It performs measurements of analog parameters, such the current flowing through conductor 121. The output of the Parametric Measurement circuit 120 and the content of the Receive Latches 119 are applied to a Formatted Receiver 124, whose function is to create the a digital indication of the desired comparison for this channel within the current vector's receive cycle. To this end, the Formatted Receiver circuit 124 is further coupled to the contents of an F/P Error Select Register 123, and whose contents are set by traffic on the IVT Bus 112. The contents of register 123 determine just what comparisons are made to form the digital pass/fail indication for the channel as a result of the current receive vector cycle. That signal is the familiar COMPARE error signal 56, of which signal 125 is one out of sixty-four such signals sent to circuit 57 in FIG. 2. The format under which the comparison is made is again indicated by FORMAT 140 and DATA 139, each of which is coupled to the Formatted Receiver 124. As with the Drive Formats Generator, the Formatted Receiver recognizes four of the eight encodings, ignores drive formats, and does not form a comparison unless it sees a receive format on lines 140. The receive formats that are implemented are compare with no load, compare with load (load value may be specified per channel), compare between High and Low, and do not compare. These receive (comparison) formats will be appreciated as conventional by those skilled in the art, and are believed to require no further explanation.

To continue, then, the Formatted Receiver 124 produces a signal FUNCTIONAL ERROR 126 that means there was a failure to compare at the level of logical representation, and a signal PARAMETRIC ERROR 127 that means a parametric measurement exceeded associated limits. These signals are always available, regardless of the content of F/P Error Select Register 123 and the meaning of the signal COMPARE ERROR 125. The sense of the signal FUNCTIONAL ERROR 126 that denotes an error is captured in a CH FE Latch 128 (Channel Functional Error Latch). CH PE Latch 129 does the same for the signal PARAMETRIC ERROR 127. These latches impart "stickiness" to their respective meanings, in that an error indication in a channel for one vector (here a logic one) will persist despite the absence of actual error conditions for subsequent vectors, until such time as the latch is reset. That is, signals 126 and 127 can set, but not clear, their respective latches 128 and 129. However, CH FE Latch 128 and CH PE Latch 129 are coupled to the IVT Bus 112, so that they may be reset when desired. Besides being reset by action of the IVT Bus, they may also be read to discover what condition produced the failure to compare.

In single DUT operation the three-bit FORMAT descriptor and its accompanying one-bit value for DATA are supplied by the fNT. SRAM 54, addressed by the circled A originating in the Micro-Controller Sequencer 19. There is one such set of signals for each channel. Thus, we see that INT.SRAM 54 functions as an local extension of PGM. SRAM 20 in the Micro-Controller Sequencer 19. This capability allows the test program to specify for every vector its own FORMAT/DATA at each bit position. If there were no multi-DUT testing or the possibility of bad blocks in a single DUT, this would be sufficient, and is essentially a conventional arrangement.

However, as previously mentioned, we desired to test multiple DUT's at the same time and on the same Test Site, and we wish to cope more effectively with bad blocks in memory devices that have blocks. To that end, we seek alternative FORMATS and DATA that can be selectively and conditionally invoked according to the turn of events during testing. The invocation of such alternate formats is frequently referred to as "jamming." An alternate FORMAT is stored in a Jam Format Register 111, and corresponding alternate DATA is stored in a Jam Data Register 113. Both of these registers get their content from the IVT Bus 112. Furthermore, which source of FORMAT (INT.SRAM 54 or register 111) is used is determined by MUX 110, in accordance with instructions received from a Format & Data Jam Control Logic circuit 115. MUX 114 does the same for DATA. The Format & Data Jam Control Logic circuit 115 receives configuration and mode of operation instructions from a Jam Control Register 116, also coupled to the IVT Bus 112. It is switching one or both of the MUX's 110 and 114 to their Jam Register positions that, at bottom, allows a DUT to be disabled, or its results faked as being good. Of course, the exact results of jamming depend on the alternate FORMAT and/or DATA that are jammed in place of the primary FORMAT and DATA.

Circuit 115 also receives signal 141, which is a sticky version of the signal FUNCTIONAL ERROR 126, a signal 142 meaning that a DUT selected for being Disabled affects this channel, a signal 143 that means that a DUT affecting this channel has been determined to exhibit a functional error, and, a similar signal 144 that means that a DUT affecting this channel has been determined to exhibit a parametric error. In all cases, the DUT associated with signals 142–144 are the same DUT, as determined by a DUT # Register 132 whose content (a value indicating one of DUT0, DUT1, DUT2 or DUT3) is set by the IVT Bus. That content (value identifying a DUT) is applied as a control input 136 to MUX 133, MUX 134, MUX 135 and to two other circuits not yet mentioned: the Functional DUT # Decoder 131 and Parametric DUT # Decoder 130.

The DUT # Register, of which there is one per channel, is not set to indicate which DUT a test program is interested in. It is used to indicate which DUT of multiple DUT's this channel is associated with, and typically is set at the beginning and left alone. Thus, the totality of the DUT # Registers establishes the correspondence between the DUT's of multi-DUT testing and the channels used to test those DUT's.

To conclude our initial description of block diagram 106, the signals 44b from logic circuit 90 in circuit 40 of FIG. 2 are applied to MUX 133. These are the DUT Disable DD0:3 signals described in connection with FIG. 4, and stand for certain ways (although not all of the ways) of deciding that a DUT is to be disabled (as were described in connection with FIG. 4). So, suppose DUT1 were to be disabled, as indicated by DD1 at MUX 133. For each instance of block diagram 106 that is associated with DUT1 the signal DD1 would pass through MUX 133 to become signal 142. The import here is that logic circuit 115 (i.e., that instance thereof for such a channel) would be told that this channel (whichever it is) is to have some form of alternate format or data invoked, instead of the primary format thereof that is used for initial testing until the discovery that selected (programmatically determined) error criteria have been met. What "some form" means is determined by the content in the associated instance of register 116, and we shall describe the range of possibilities shortly below. To reiterate, the sixty-four DUT # Registers 132 are the core of the channel-to-DUT correspondence mechanism, and should not be thought of as identifying a DUT, but as including or excluding this channel in some action on behalf of a DUT it is associated with. One level we may speak of "disabling a DUT" while on another we recognize that at the lowest level we only ever do something different for those channels that represent the DUT. And we might not do whatever that thing is to all of the channels, and we might do different things to different channels.

Now consider Parametric DUT # Decoder 130. It receives the latched and sticky PARAMETRIC ERROR and the DUT # signal 136 from register 132. What decoder 130 does is map its input onto a corresponding line representing the DUT, and that is then wired OR'ed with that same function for each of the other channels. This wire OR'ing produces the DUT Parametric Error signals 104 (DPE0, DPE1, DPE2 and DPE3), which are sent out from circuit 52 to the Next Address Calculator 102 in Micro-Controller Sequencer 19 of FIG. 2, and are also applied to MUX 134, so that the appropriate one thereof can become signal 143. A similar arrangement obtains for Functional DUT # Decoder 131, and the DUT Functional Error signals 103.

What block diagram 106 does with regard to controlling MUX's 110 and 114 is determined by the Format & Data Jam Control Logic circuit 115. Here is a description of its functional attributes:

(A) Signal 142 goes true because of a decision taken by the test program, or any other event that would cause one of DUT Disable signals 44b. That means that this channel is associated with a DUT that is to be disabled, and therefore, that the alternate FORMAT and/or DATA definitions are to be invoked.

(B) This channel is explicitly to be disabled. This is indicated by a bit in Jam Control Register 116. The result is that the alternate FORMAT and/or DATA definitions are to be invoked.

(C) Invoke the alternate FORMAT and/or DATA definitions for this channel if this channel is associated with a DUT that has been determined to exhibit a DUT Functional Error (a DFE signal becomes signal 144).

(D) Invoke the alternate FORMAT and/or DATA definitions for this channel if this channel has been determined to exhibit a channel Functional Error (signal 141). This is what can be used to prevent overprogramming.

(E) Invoke the alternate FORMAT and/or DATA definitions for this channel if this channel is associated with a DUT that has been determined to exhibit a DUT Parametric Error (a DPE signal becomes signal 143).

(F) (C), (D) and (E) can be selected to occur continuously until the associated error occurs, or begin continuously afterwards.

These attributes of circuit 115 appear complex; actually they are simply more numerous than convoluted, and it will be appreciated that their implementation is essentially the reduction of the binary input signals to a logic equation that can then be synthesized by any of several well known techniques.

It will be appreciated that we have described a mechanism for invoking alternate FORMAT's and DATA, on a vector by vector basis, and for each channel within a DUT. The FORMAT includes both drive and compare components, and a number of useful features are obtained by proper selection of these alternates. For example, a channel can be made to appear good, even when it is not, by jamming a "no compare" as the alternate FORMAT. The alternate FORMAT can specify a drive format in place of a compare format, with the result that no comparison is performed and no error is generated. (We assume, of course, that the programmer knows the circumstances in which this is useful.) Such drive removal is also good for preventing overprogramming by automatically jamming, on a pin/channel basis, the data sent to the DUT once that bit appears successfully programed.

Figure 6:
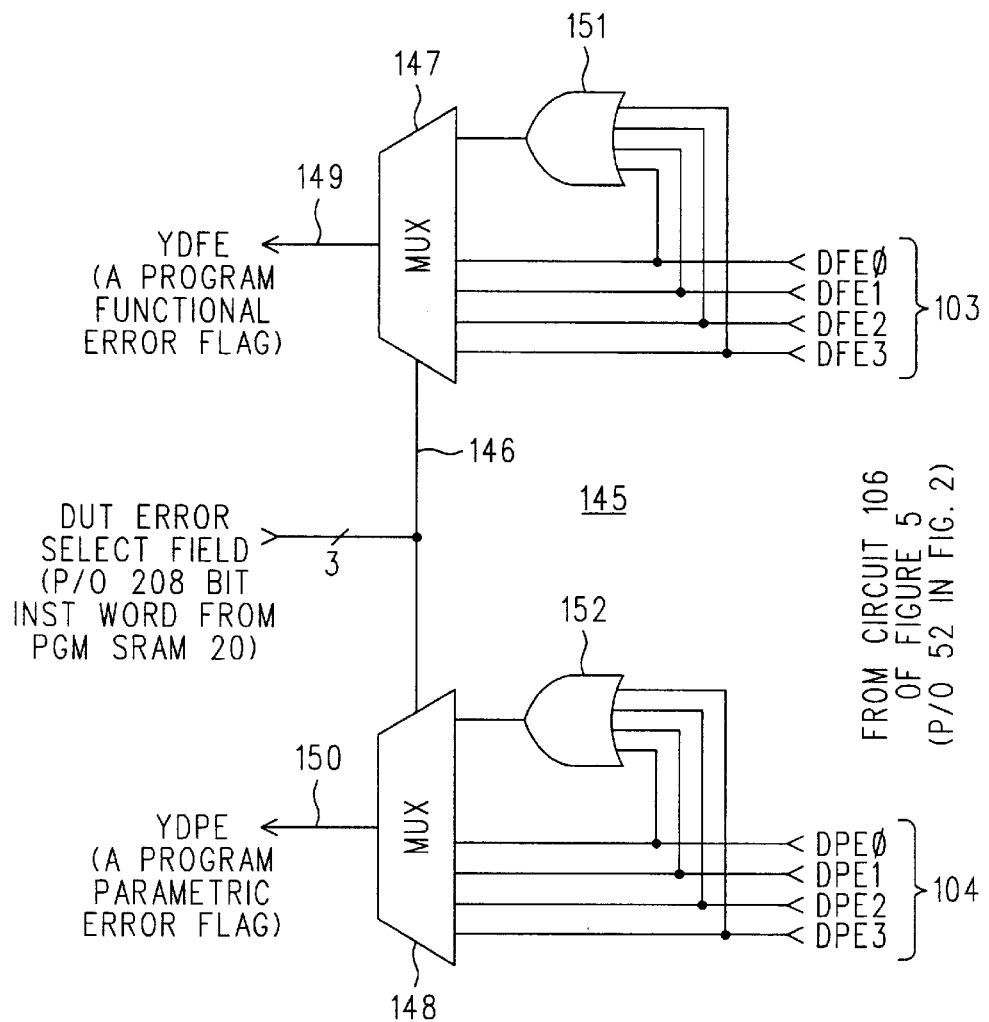
FIG. 6 is a block diagram of logic circuitry located within the Next Address Calculator of the Micro-Controller Sequencer of FIG. 2 and that facilitates test program branching on conditions associated with different DUT's during multi-DUT testing.

Refer now to FIG. 6, which is a block diagram 145 of some logic circuitry located within the Next Address Calculator 102 of the Micro-Controller Sequencer 19 of FIG. 2. This circuitry is there to augment the branching on DUT error condition described in the incorporated Application entitled METHOD AND APPARATUS FOR NO-LATENCY CONDITIONAL BRANCHING. What the circuitry does, in accordance with a DUT ERROR SELECT FIELD 146 in the 208-bit instruction word from PGM. SRAM 20, and the application of that field to MUX 147, is select either a specified one or the OR of any of the DUT Functional Error signals 103 to become signal 149 YDFE (Yes DUT Functional Error). A similar selection from DUT Parametric Error signals 104 by MUX 148 produces signal 150 YDPE (Yes DUT Parametric Error). It is the signals 149 and 150 that are used to effect DUT error related branching in the Micro-Controller Sequencer's test program. These signals (149 and 150) are what are respectively referred to as "a program functional error flag" and a "program parametric error flag" in the incorporated disclosure mentioned earlier in this paragraph.

Consider the following segment of pseudo code for a test program, wherein the line numbers in parentheses are for reference only:

(1) format DUT0 drive_pattern0, format DUT1 drive_pattern1, format DUT2 drive_pattern2, format DUT3 drive_pattern3;

(2) format DUT0 check_pattern0, format DUT1 check_pattern1, format DUT2 check_pattern2, format DUT3 check_pattern3;

(3) errsel=0, jump (ferr) DUT0_ERROR;

(4) errsel=1, jump (ferr) DUT1_ERROR;

(5) errsel=2, jump (ferr) DUT2_ERROR;

(6) errsel=3, jump (ferr) DUT3_ERROR;

This segment of code would be nested within a loop that supplies an address to the DUT that changes once per iteration of the loop. If there are no error the jumps at lines (3)–(6) will not occur. However, suppose that there is an error associated with DUT1. Then line four will cause a jump to the routine named DUT1_ERROR. This happens because the compiler of the test program arranged for the micro code corresponding to line (4) of the pseudo code segment to put into the DUT ERROR SELECT field (146 of FIG. 6) a value that causes MUX's 147 and 148 to select signals DFE1 and DPE1 to become signals YDFE (149) and YDPE (150), respectively. Different locations in the micro code will have different values for field 146. Thus, for line (6) signals DFE3 and DPE3 are selected.

The result of the foregoing disclosure to this point is a powerful combination of programmable and configurable mechanisms that will autonomously disable specific channels, or those channels related to one DUT from among many, as is needed to support multi-DUT operation and certain other useful features related to the testing of non-volatile memories, without requiring multi-threaded programming.

Figure 7:
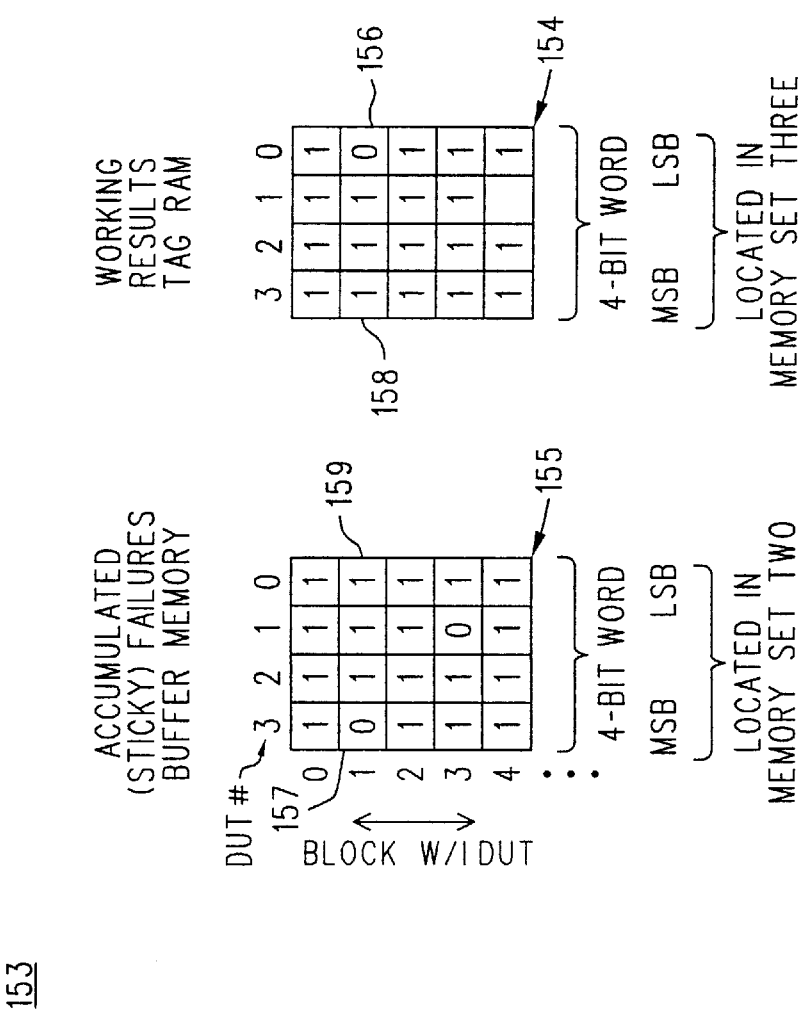
FIG. 7 is a simplified diagram illustrating a technique for automatically disabling channels associated with a bad block in a memory DUT having a block structure.

One particular feature deserves further attention. Refer now to FIG. 7, wherein is depicted various example tables in memory that may be used, in conjunction with subject matter set out above, to facilitate the testing of memory DUT's that have an internal block structure. Suppose that we are to test a DUT that has a block structure, and further that it is only an eight-bit device, so we are emboldened to test four of them at a time. The desire is to be able to selectively disable the channels that are associated with a block/DUT combination when we have discovered that it is bad. We want to do this to remove multiple thread considerations, and perhaps also to keep from unnecessarily banging into loop indices and issue more drive cycles to the DUT than are needed.

Consider two tables in the SRAM Memory Sets (these tables are not so big as to need the DRAM Memory Sets, and we prefer the SRAM to the DRAM for other reasons that are not pertinent here). In particular, establish a WORKING RESULTS Tag RAM 154 in Memory Set Three 76. Use the narrow word feature to set the effective word width to four bits, and assume the bit position/DUT correspondence to be the LSB in the table is DUT0, and the MSB is DUT3. Different addresses in the table represent the different blocks in the DUT's. Pre-load the table, and another one 155 just like it in Memory Set 2 (75), with all ones (all blocks good, no failures).

Now begin testing, which we assume takes the form of a series of loops, perhaps with each instance of the loop stepping through the blocks to perform a different type of test. Each instance of the loop can decide that a block is bad (although the possibility of repair is not being ruled out by anything said here). Using well known Address Classification and Data Classification techniques, table 154 operates as a Tag RAM to register bad blocks indexed by table address, with DUT's indexed by bit position. Do a first pass through the loop. During this time the four bits of table 155 will be read out each time there is a new address to Memory Set Two (remember the magic of the signal BAD BLOCK MODE 105) and will be applied to MUX 94 of FIG. 4, which also will have been enabled to pass its input through to become DUT Disable signals 44b. However, since the table 155 has been pre-loaded with all ones, no failures are indicated, and no DUT's will be disabled during this pass of the loop.

Now assume that this first pass through the loop found an error in block 1 of DUT3; that spot (158) in table 154 would now have a zero. Before beginning the next instance of the loop we arrange for table 154 to be copied into table 155; observe that there is a zero in location 157 of table 155. The copying of working table 154 into accumulated table 155 is performed in a mode that preserves zeros already in a location (makes them "sticky"), and protects them from being overwritten with ones. Now re-initialize table 154 and start the next instance of the loop. During that next instance of the loop block one of DUT3 will have its channels disabled, or reported as "good" regardless of the actual facts (depending on how the block diagram 106 of FIG. 6 has been configured and the nature of the particular jamming performed). This process is continued until all testing has been accomplished. Along the way we may surmise that block three of DUT1 had an error, and that a loop in progress (or perhaps just finished) discovered trouble in block one of DUT0 (cell 156 in table 154) and that this will soon appear in cell 159 of table 155.

Now, there is one additional aspect of this kind of testing that should be pointed out. The process of copying table 154 to table 155 can be performed utilizing the counter resources in the Post Decode circuit 60. This particular trick is, in and of itself, conventional, so we won't spend any time on how it is done internally. But, it should be appreciated that those counters can be set to count down from some pre-set value, and not indicate an output for their associated quantity until the counter bottoms out. The net effect, as far as our example is concerned, is that it might take, say, n-many failures of a DUT/block combination occurring (over time) in the WORKING RESULTS Tag RAM (table 154) before a zero is written to the corresponding cell in the ACCUMULATED FAILURES buffer memory table 155.

We claim:

1. A method of simultaneously testing multiple DUT's using a single test site in a memory tester, the method comprising the steps of:

(a) contacting the multiple DUT's with probes corresponding to channels within the single test site;

(b) associating a collection of channels with each DUT in the multiplicity thereof;

(c) defining for each channel a primary format for applying transmit vectors and interpreting receive vectors, each channel's primary format for use initially and in the absence of detected errors for that channel, and also an alternate format for applying transmit vectors and interpreting receive vectors, each channel's alternate format for use subsequent to there being detected selected error criteria for that channel;

(d) generating with a test program a sequence of transmit vectors and expected receive vectors and applying the transmit vectors to the channels associated with all DUT's in the multiplicity thereof, each channel using the primary format associated therewith;

(e) comparing a receive vector actually received from the DUT with an expected receive vector and determining that a channel is a non-comparing channel;

(f) pursuant to step (b) and in response to step (e), generating an indication that the DUT within the multiplicity thereof, and with which the non-comparing channel is associated, has met selected error criteria and is to be disabled; and (g) subsequent to step (f), using for the non-comparing channel the alternate format associated with that non-comparing channel.

2. A method as in claim 1 wherein subsequent to step (f) the alternate format is used for each channel associated with the DUT to be disabled.

* * * * *